United States Patent
Kawamura et al.

(10) Patent No.: US 9,624,604 B2
(45) Date of Patent: Apr. 18, 2017

(54) METHOD FOR SYNTHESIZING HEXAGONAL TUNGSTEN NITRIDE, AND HEXAGONAL TUNGSTEN NITRIDE

(71) Applicant: National Institute for Materials Science, Ibaraki (JP)

(72) Inventors: Fumio Kawamura, Tsukuba (JP); Hitoshi Yusa, Tsukuba (JP); Takashi Taniguchi, Tsukuba (JP)

(73) Assignee: National Institute for Material Science, Ibaraki (JP)

( * ) Notice: Subject to any disclaimer, the term of this patent is extended or adjusted under 35 U.S.C. 154(b) by 3 days.

(21) Appl. No.: 14/434,446

(22) PCT Filed: Oct. 9, 2013

(86) PCT No.: PCT/JP2013/077492
§ 371 (c)(1),
(2) Date: Apr. 9, 2015

(87) PCT Pub. No.: WO2014/057982
PCT Pub. Date: Apr. 17, 2014

(65) Prior Publication Data
US 2015/0315023 A1 Nov. 5, 2015

(30) Foreign Application Priority Data

Oct. 12, 2012 (JP) ................ 2012-226541

(51) Int. Cl.
*C30B 29/38* (2006.01)
*C01B 21/06* (2006.01)
*B23B 27/14* (2006.01)

(52) U.S. Cl.
CPC ............ *C30B 29/38* (2013.01); *C01B 21/062* (2013.01); *B23B 27/148* (2013.01); *C01P 2002/72* (2013.01); *C01P 2002/76* (2013.01); *C01P 2004/03* (2013.01); *C01P 2004/61* (2013.01); *Y10T 428/2982* (2015.01)

(58) Field of Classification Search
CPC ... C01B 21/062; C30B 29/38; C01P 2002/72; C01P 2002/76; C01P 2004/61; C01P 2004/03; B23B 27/148; Y10T 428/2982
USPC .......................................... 428/402; 423/409
See application file for complete search history.

(56) References Cited

U.S. PATENT DOCUMENTS 8,529,696 B2 * 9/2013 Watanabe ................ B01J 3/062
117/73

FOREIGN PATENT DOCUMENTS

| JP | 2005-330540 | * 12/2005 |
| JP | 2013-18688 | * 1/2013 |
| JP | 2013-18688 A | 1/2013 |

OTHER PUBLICATIONS

Wriedt, The N—W (Nitrogen-Tungsten) System, Bulletin of Alloy Phase Diagrams, vol. 10, No. 4 1989, pp. 358-367.
Wang et al., Synthesis, Crystal Structure, and Elastic Properties of Novel Tungsten Nitrides, Chemistry of Materials, 2012, 24, pp. 3023-3028.
Kawamura et al., Synthesis or rhenium citride crystals with MoS2 structure, Applied Physics Letters, 100, 251910, 2012.

* cited by examiner

*Primary Examiner* — Leszek Kiliman
(74) *Attorney, Agent, or Firm* — Morgan, Lewis & Bockius LLP

(57) ABSTRACT

The present invention addresses the problem of providing a method for synthesizing hexagonal tungsten nitride by synthesizing hexagonal tungsten nitride as a main product, and of providing the hexagonal tungsten nitride. The problem is solved through use of a method for synthesizing hexagonal tungsten nitride comprising synthesizing hexagonal tungsten nitride by heating a starting material powder containing a tungsten halide and an alkali metal nitride and/or an alkaline earth metal nitride.

20 Claims, 7 Drawing Sheets

FIG.1
(a)
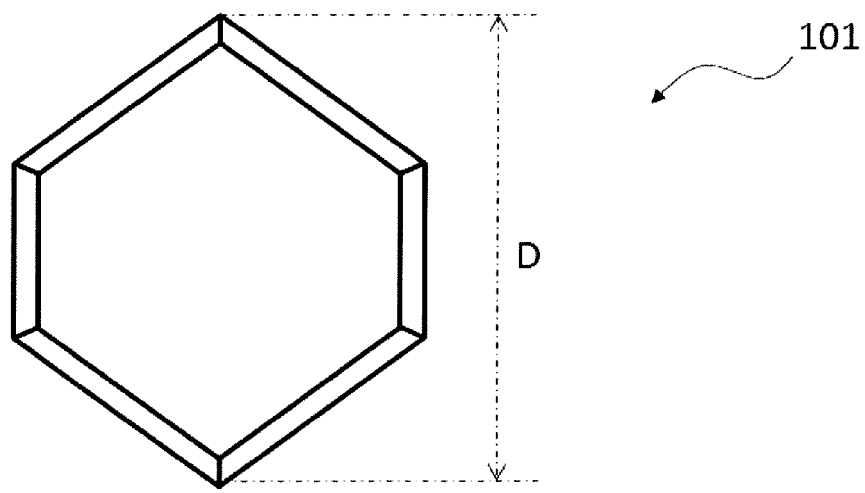
(b)
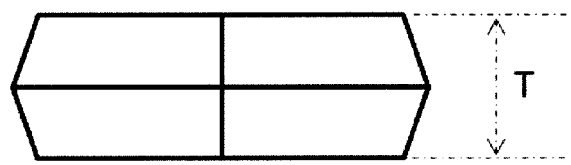

FIG.2
(a)
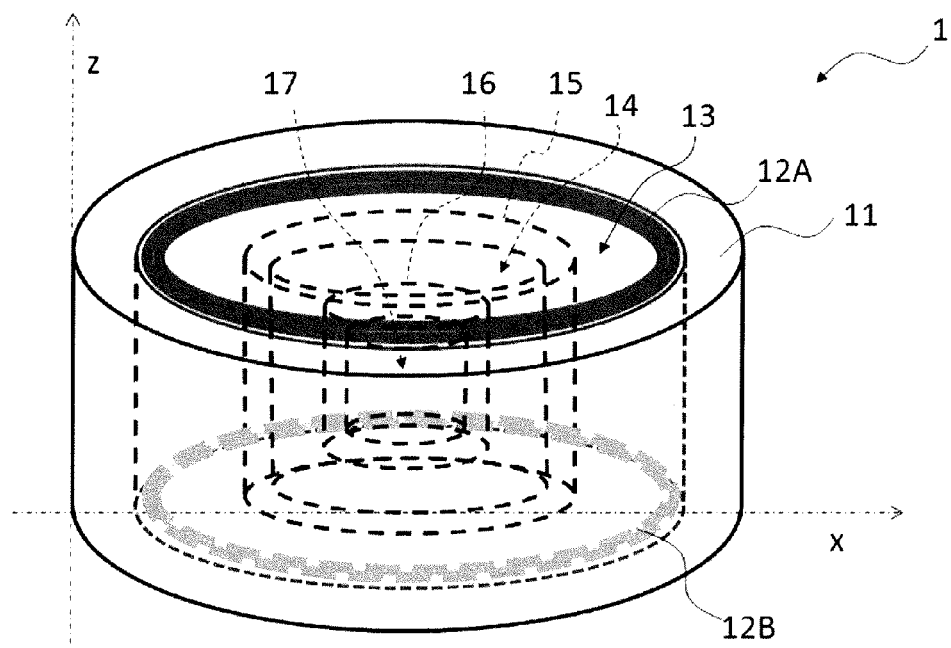
(b)
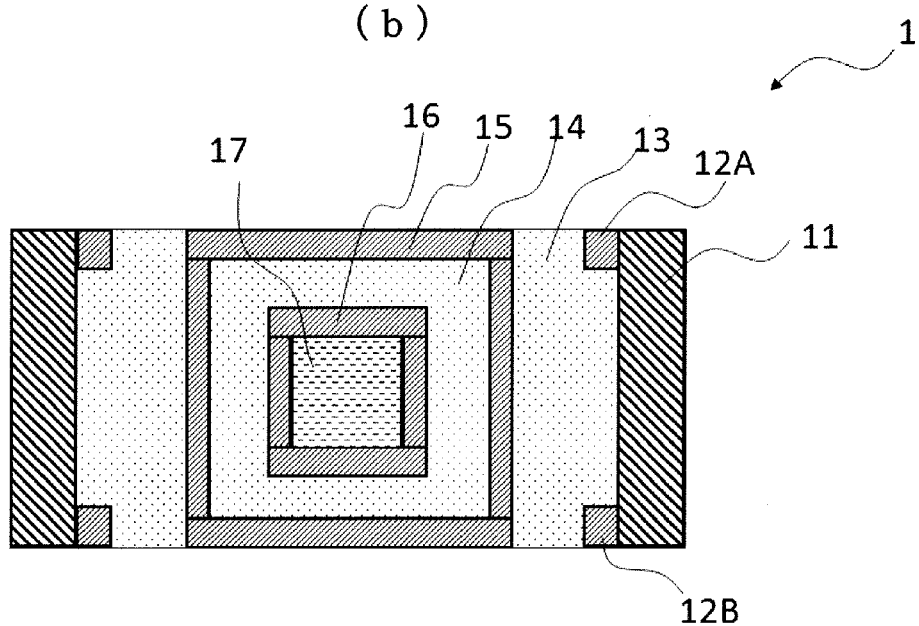

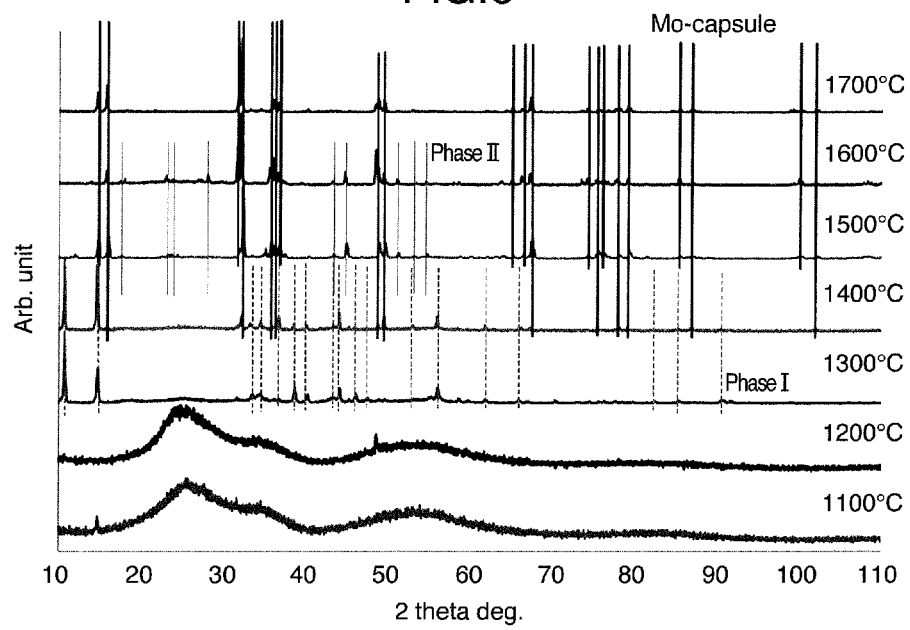
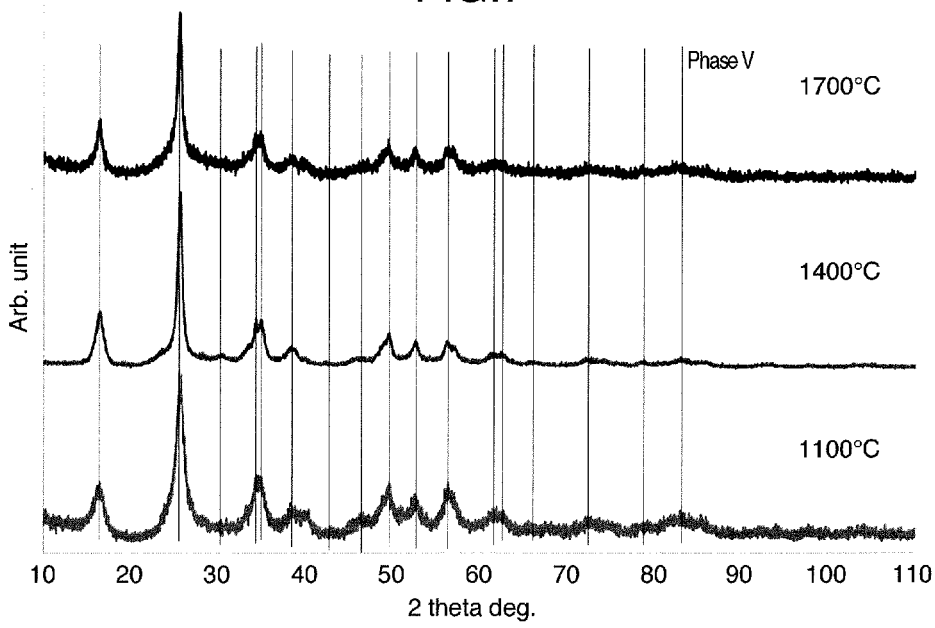

METHOD FOR SYNTHESIZING HEXAGONAL TUNGSTEN NITRIDE, AND HEXAGONAL TUNGSTEN NITRIDE

TECHNICAL FIELD

The present invention relates to the method for synthesizing a hexagonal tungsten nitride, and the hexagonal tungsten nitride.

BACKGROUND ART

Until now, cemented carbides have been widely used as cemented carbide materials for use in grinding and cutting tools (e.g. drills, end mills, hobs, milling cutters, lathes, and pinion type cutters) and the like. Cemented carbide is an alloy formed by sintering hard metal carbide powders.

There is tungsten carbide as one of the cemented carbides. The tungsten carbide excels in heat resistance and chemical stability in addition to the property of high hardness. Therefore, the tungsten carbide has been used as a representative material for cemented carbide tools for many years. The cemented carbide tools are ones utilizing the cemented carbide. Heretofore, the cemented carbide tools have been widely used in metalworking for parts such as engine parts, transmission parts and stirring parts for automobiles.

However, the materials such as carbon fiber composite materials have been recently come into use in airframes and the like, and some of the carbon fiber composite materials have higher hardness than the conventional materials. Thus, when treating such materials with the tool made of the tungsten carbide, there were some instances where this tool was severely worn away to cause disruption. Accordingly, the developments of the cemented carbide materials having higher hardness than the tungsten carbide have been desired.

On the other hand, from the studies based on the theoretical calculations, hexagonal tungsten nitrides are predicted to be high hardness materials comparable to or exceeding the tungsten carbide (Non Patent Literature 1). Accordingly, the hexagonal tungsten nitrides are expected as the next generation cemented carbide materials.

The hexagonal tungsten nitrides include various structures such as h-$W_2N_3$ and δ-WN. For example, the $K_0$ of h-$W_2N_3$ is 331 GPa and the $K_0$ of δ-WN is 396 GPa, and thus the both structures are very hard (Non Patent Literature 2). The $K_0$ means a volume modulus.

Very recently, a success in the synthesis of the hexagonal tungsten nitride having the h-$W_2N_3$ structure was reported in a literature (Non Patent Literature 2).

In this literature, however, only a small amount of the hexagonal tungsten nitride having the h-$W_2N_3$ structure was obtained as a by-product, which was mixed in other crystal phases. In short, the method described in this literature has been far from practical use as the method for synthesizing the hexagonal tungsten carbide having the h-$W_2N_3$ structure.

CITATION LIST

Non Patent Literature

Non Patent Literature 1: H. A. Wriedt, The N-W (Nitrogen-Tungsten) System, Bulletin of Alloy Phase Diagrams, Vol. 10, No. 4 1989, pp. 358-367
Non Patent Literature 2: Shanmin Wang, Xiaohui Yu, Zhijun Lin, Ruifeng Zhang, Duanwei He, Jiaqian Qin, Jinlong Zhu, Jiantao Han, Lin Wang, Ho-kwang Mao, Jianzhong Zhang, and Yusheng Zhao, Synthesis, Crystal Structure, and Elastic Properties of Novel Tungsten Nitrides, Chem. Mater., 2012, 24, pp. 3023-3028
Non Patent Literature 3: Fumio Kawamura, Hitoshi Yusa, and Takashi Taniguchi, Synthesis of rhenium nitride crystals with $MoS_2$ structure, APPLIED PHYSICS LETTERS, 100, 251910 (2012)

SUMMARY OF INVENTION

Technical Problem

The objects of the present invention are to provide the method for synthesizing hexagonal tungsten nitride wherein the hexagonal tungsten nitride is synthesized as a main product, and the hexagonal tungsten nitride having a large particle size.

Solution to Problem

The present inventors had long conducted the research and development of the cemented carbide materials, and succeeded in the synthesis of rhenium nitride last year (Non Patent Literature 3). In consideration of the results, the present inventors continued to further study the cemented carbide materials, found that a transition metal nitride can be synthesized by reacting an alkali metal nitride with a transition metal halide, and still further studied the application of the findings to various materials. As a result, the present inventors have newly found a method capable of synthesizing a hexagonal tungsten nitride as a main product by the application of the above method for synthesizing rhenium nitride, thereby achieving the present invention.

The present invention includes the following.

(1) A method for synthesizing a hexagonal tungsten nitride, wherein the hexagonal tungsten nitride is synthesized by heating raw material powders comprising a tungsten halide and an alkali metal nitride or alkaline earth metal nitride or raw material powders comprising a tungsten halide and a mixture of an alkali metal nitride and an alkaline earth metal nitride.

(2) The method for synthesizing a hexagonal tungsten nitride according to (1), wherein the heating is conducted at a temperature in a range of 1400° C. or more and 1700° C. or less.

(3) The method for synthesizing a hexagonal tungsten nitride according to (1) or (2), wherein the heating is conducted under an applied pressure of 1 GPa or more.

(4) The method for synthesizing a hexagonal tungsten nitride according to any one of (1) to (3), wherein the heating is conducted for one hour or more in a high temperature and pressure state of a temperature in a range of 1400° C. or more and 1700° C. or less and an applied pressure of 1 GPa or more.

(5) The method for synthesizing a hexagonal tungsten nitride according to any one of (1) to (4), wherein the raw material powders to be heated are filled into a capsule made of tungsten or molybdenum.

(6) The method for synthesizing a hexagonal tungsten nitride according to any one of (1) to (5), wherein the raw material powders comprising the tungsten halide and the alkali metal nitride or alkaline earth metal nitride are adjusted so that a mole ratio of the tungsten halide to the alkali metal nitride or alkaline earth metal nitride is within a range from 3:2 to 3:1.

(7) The method for synthesizing a hexagonal tungsten nitride according to any one of (1) to (6), wherein the hexagonal tungsten nitride has a structure of δ-WN.

(8) The method for synthesizing a hexagonal tungsten nitride according to any one of (1) to (5), wherein the raw material powders comprising the tungsten halide and the alkali metal nitride or alkaline earth metal nitride are adjusted so that a mole ratio of the tungsten halide to the alkali metal nitride or alkaline earth metal nitride is 1:6.

(9) The method for synthesizing a hexagonal tungsten nitride according to (8), wherein the hexagonal tungsten nitride has a structure of $h\text{-}W_2N_3$.

(10) The method for synthesizing a hexagonal tungsten nitride according to any one of (1) to (9), wherein the tungsten halide is tungsten chloride and the alkali metal nitride is sodium azide.

(11) A hexagonal tungsten nitride of which a particle size is in a range of 1 μm or more and 50 μm or less.

Advantageous Effects of Invention

Since the method for synthesizing a hexagonal tungsten nitride according to the present invention comprises heating the raw material powders comprising a tungsten halide, and an alkali metal nitride and/or an alkaline earth metal nitride in order to synthesize the hexagonal tungsten nitride, the synthesized hexagonal tungsten nitride can be obtained as a main product. The synthesized hexagonal tungsten nitride can be used as blade materials or hard coating materials for the cemented carbide tools used in cutting. This leads to improve working accuracy of the cemented carbide tools and reduce costs needed to produce parts using the cemented carbide tools.

According to the present invention, the hexagonal tungsten nitride of which the particle size is 1 μm or more and 50 μm or less can be obtained. In particular, the hexagonal tungsten nitride in a range of 1 μm or more and 50 μm or less can be usefully utilized as the tools. Specifically, the synthesized hexagonal tungsten nitride can be used as blade materials or hard coating materials for the cemented carbide tools used in cutting, thereby leading to improve working accuracy of the cemented carbide tools and to reduce costs needed to produce parts using the cemented carbide tools.

In addition, the hexagonal tungsten nitride according to the present invention can vary its particle size in a wide range by changing the synthetic conditions, and thus even the hexagonal tungsten nitride of which a particle size is 1 mm is realizable.

BRIEF DESCRIPTION OF DRAWINGS

FIG. 1 is the drawing showing an example of a hexagonal tungsten nitride according to an embodiment of the present invention, in which FIG. 1(a) shows its plane view and FIG. 1(b) shows its front view.

FIG. 2 is the drawing showing an example of a high pressure cell used in a method for synthesizing a tungsten nitride according to an embodiment of the present invention, in which FIG. 2(a) shows its perspective view and FIG. 2(b) shows its sectional view.

FIG. 6 is the XRD profiles of the samples of Example 1-5 to Example 1-8 and Comparative Example 1-2 to Comparative Example 1-4.

FIG. 7 is the XRD profiles of the samples of Comparative Example 1-5 to Comparative Example 1-7 sample.

FIG. 10 is the profiles showing the results of the micro area X-ray diffraction measurement for the sample of Example 1-4, in which FIG. 10(a) shows observed data and FIG. 10(b) shows theoretical data for hexagonal WN.

Figure 3:
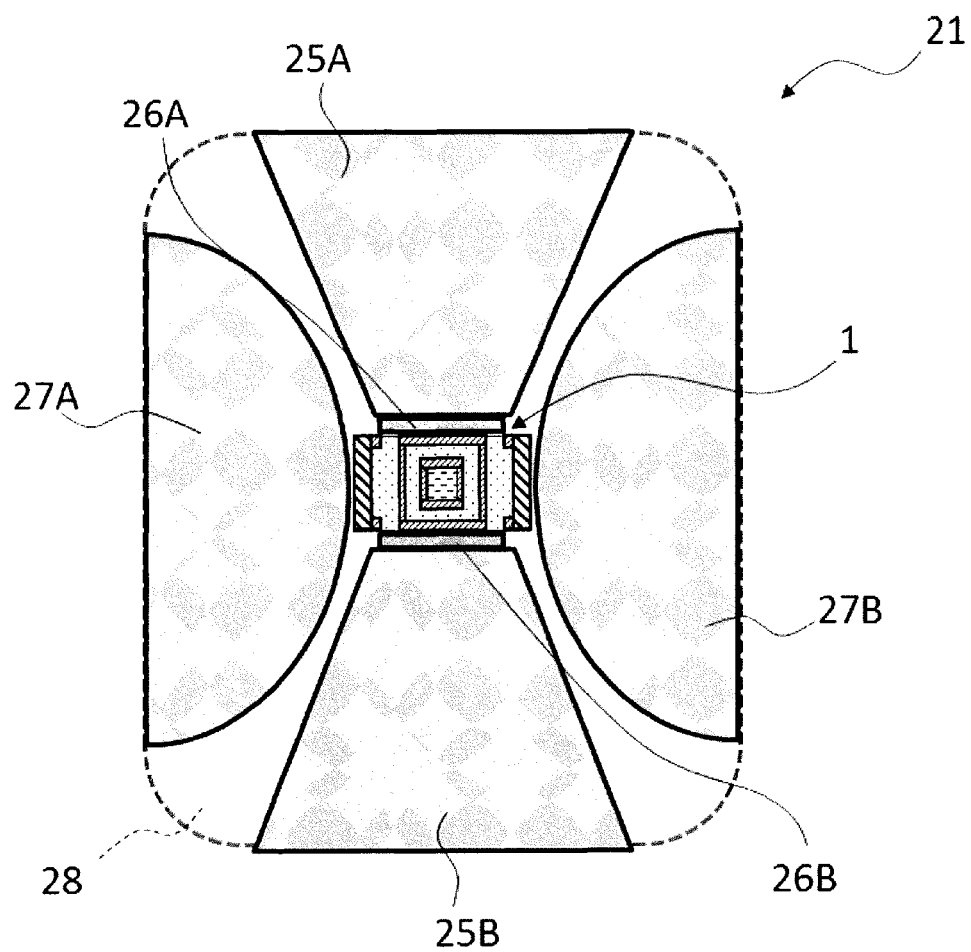
FIG. 3 is the sectional view showing an example of a heating and pressurizing apparatus used in a method for synthesizing a tungsten nitride according to an embodiment of the present invention.

DESCRIPTION OF EMBODIMENTS (Embodiments of the Present Invention)

Hereinafter, according to embodiments of the present invention, the method for synthesizing a hexagonal tungsten nitride and the hexagonal tungsten nitride are explained as described below, referring to the attached drawings.

<Hexagonal Tungsten Nitride>

FIG. 1 is the drawing showing an example of a hexagonal tungsten nitride according to an embodiment of the present invention, in which FIG. 1(a) shows its plane view and FIG. 1(b) shows its front view.

As shown in FIG. 1, the hexagonal tungsten nitride according to the embodiment of the present invention has a plate-like hexagonal shape. The hexagonal tungsten nitride has the two hexagonal faces parallel to each other and having almost the same areas, and twelve trapezoid-shaped faces are formed between the above two faces. These twelve trapezoid-shaped faces have a plane symmetry in terms of the symmetry relationship between each of the six faces on the upper side and each of the six faces on the lower side with respect to a virtual hexagonal face wherein the virtual hexagonal face is located between the above two faces and is equally spaced from the both faces. The size of the above virtual face is larger than the sizes of the above two faces in the plane view of the plate-like hexagonal shape, and decreases from the above virtual face toward the above hexagonal face. This merely shows an example according to an embodiment of the present invention, and the hexagonal tungsten nitride according to the embodiment of the present invention also includes the embodiments having the characterization of the other hexagonal crystal structures equivalent to the crystal structure of the hexagonal tungsten nitride shown in FIG. 1.

Particle size D of the hexagonal tungsten nitride according to the embodiment of the present invention is 1 μm or more and 50 μm or less. Thus, the hexagonal tungsten nitride according to the embodiment of the present invention can be used as blade materials or hard coating materials for cemented carbide tools used in cutting, thereby leading to improve working accuracy of the cemented carbide tools and to reduce costs needed to produce parts using the cemented carbide tools.

In the cases where it is useful for tools that the particle size of the hexagonal tungsten nitride is smaller, the above size is preferably 50 μm or less. In view of the ease of handling, the above size is preferably 1 μm or more.

More preferably, the particle size D is 10 μm or more and 30 μm or less, and still more preferably 15 μm or more and 25 μm or less.

However, the hexagonal tungsten nitride according to the embodiment of the present invention can vary its particle size in a wide range by changing the synthetic conditions, and thus even the hexagonal tungsten nitride of which the particle size D is 1 mm is realizable.

Thickness T of the hexagonal tungsten nitride according to the embodiment of the present invention is smaller than the particle size D in view of the constitution of the crystal growth.

<Method for Synthesizing Hexagonal Tungsten Nitride>

In the method for synthesizing a hexagonal tungsten nitride according to an embodiment of the present invention, the hexagonal tungsten nitride is synthesized by heating raw material powders, the raw material powders use a tungsten halide and an alkali metal nitride or alkaline earth metal nitride, or a tungsten halide and a mixture thereof (i.e. a mixture of an alkali metal nitride and an alkaline earth metal nitride).

In addition to these, the raw material powders may include a metallic tungsten, an alkali metal, an alkaline earth metal, a tungsten oxide, or a salt such as NaCl, or a mixture including at least two or more of them (i.e. the metallic tungsten, the alkali metal, the alkaline earth metal, the tungsten oxide, or the salt such as NaCl).

The tungsten halide used in the present invention includes tungsten fluoride ($WF_6$), tungsten bromide ($WBr_5$), tungsten iodide ($WI_4$), and tungsten chloride ($WCl_6$), and particularly, tungsten chloride ($WCl_6$) is preferred. As the alkali metal nitride used in the present invention, sodium azide ($NaN_3$) or lithium nitride ($Li_3N$) is preferred, and as the alkaline earth metal nitride used in the present invention, calcium nitride ($Ca_3N_2$), magnesium nitride ($Mg_3N_2$), strontium nitride ($Sr_3N_2$) or barium nitride ($Ba_3N_2$) is preferred.

As described above, the raw material powders used in the method for synthesizing a hexagonal tungsten nitride according to the embodiment of the present invention include the tungsten halide, and the alkali metal nitride and/or the alkaline earth metal nitride.

FIG. 2 is the drawing showing an example of a high pressure cell used in the method for synthesizing a tungsten nitride according to an embodiment of the present invention, in which FIG. 2(a) is its perspective view and FIG. 2(b) is its sectional view.

A high pressure cell 1 is generally constituted by a cylindrical pyrophyllite 11, two steel rings 12A and 12B disposed in the cylinder of the pyrophyllite 11 in contact with the inner wall surface of the cylinder on the upper side and lower side, respectively, a cylindrical carbon heater 15 disposed on the central axis side of the steel rings 12A and 12B, a capsule 16 disposed inside the carbon heater 15, and raw material powders 17 filled into the capsule 16.

Powders for filling 13 are filled in a gap between the pyrophyllite 11 and the carbon heater 15 and powders for filling 14 are filled also in a gap between the carbon heater 15 and the capsule 16.

Hereinafter, an example of a process for preparing the high pressure cell is described using the high pressure cell shown in FIG. 2.

First, tungsten chloride ($WCl_6$) powders and sodium azide ($NaN_3$) powders are mixed so that a ratio of the tungsten chloride to the sodium azide is 3:2 (by mole ratio) to prepare the raw material powders 17.

Then, the raw material powders 17 are filled into the cylindrical capsule 16 which is made of W and of which one end side is closed with a disc-like lid, followed by sealing the other end side with a disc-like lid.

Subsequently, the inner bottom portion in the cylindrical carbon heater 15 of which one end side is closed with the disc-like lid is covered with the powders for filling 14, then the sealed capsule 16 is disposed in the cylindrical carbon heater 15 so as to be coaxial therewith, the powders for filling 14 are filled in the gap between the capsule 16 and the inner wall surface of the carbon heater 15, further the upper portion of the capsule 16 is covered with the powders for filling 14, and then the other end side is sealed with the disc-like lid.

The powders for filling used herein may include, for example, NaCl+10 wt % $ZrO_2$.

Subsequently, the sealed cylindrical carbon heater 15 is disposed in the cylindrical pyrophyllite 11 so as to be coaxial therewith, and then the powders for filling 13 are filled in the gap between the carbon heater 15 and the inner wall surface of the pyrophyllite 11.

Subsequently, the steel ring 12A is pressed so as to be embedded into the powders for filling 13 on the upper side of the inner wall surface of the pyrophyllite 11, and the steel ring 12B is pressed so as to be embedded into the powders for filling 13 on the lower side of the inner wall surface of the pyrophyllite 11.

Figure 4:
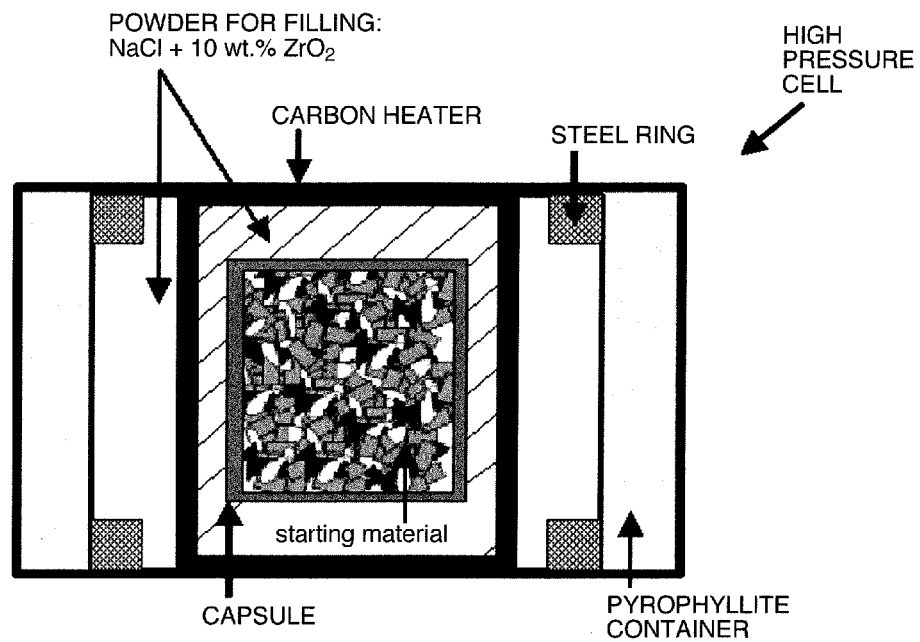
FIG. 4 is the configuration diagram of the high pressure cell used in the present Examples.

In this manner, the high pressure cell 1 shown in FIG. 4 is provided.

FIG. 3 is the sectional view showing one example of a heating and pressurizing apparatus used in the method for synthesizing a tungsten nitride according to an embodiment of the present invention.

Hereinafter, the heating and pressurizing apparatus 21 shown in FIG. 3 is used for illustration.

First, the high pressure cell 1 is disposed at a prescribed position between anvils 25A and 25B and between cylinders 27A and 27B of the heating and pressurizing apparatus 21, and is placed in contact with electric conductors 26A and 26B each of which is composed of a thin metal plate.

Then, pyrophyllite 28 is filled between these members and the high pressure cell 1.

Then, the anvils 25A and 25B, and cylinders 27A and 27B are moved toward the side of the high pressure cell 1, and then the high pressure cell 1 is pressurized.

Preferably, the applied pressure is 1 GPa or more, more preferably 3 GPa or more, and still more preferably 5 GPa or more. The pressurization can enhance the close contact between reagents used, and thus can promote the reaction, thereby facilitating the synthesis of the hexagonal tungsten nitride. The applied pressure is preferably less than 15 GPa in view of the life time of the apparatus members and the like.

Then, the high pressure cell 1 is heated to 1400° C. in the pressurized state of 1 GPa or more. Preferably, the heating temperature is 1400° C. or more and 1700° C. or less. In this way, the hexagonal tungsten nitride can be easily synthesized. At 1400° C. or more, the hexagonal tungsten nitride can be easily synthesized, and at 1700° C. or less, the decrease in the hexagonal tungsten nitride yield can be suppressed.

The state of the heating temperature of 1400° C. and the applied pressure of 1 GPa or more is maintained for a prescribed period of time.

Preferably, this high temperature and pressure state is maintained for 1 hour or more. This can efficiently react the raw material powders at the high temperature and pressure, thereby increasing the hexagonal tungsten nitride yield. When the high temperature and pressure state is maintained for 1 hour or more, the residues of the raw materials unreacted can be suppressed.

When an alkali metal nitride (which is also represented by "A" herein) is used in the reaction under the conditions of the above high temperature and pressure, the metathetical reactions represented by the following reaction formulas (i.e. Formulas (1) and (2)) proceed.

[Formula 1]

$$WX_6+cA_aN_b \rightarrow WN+acAX+(bc-1)/2 \cdot N_2\uparrow+(3-ac/2) \cdot X_2\uparrow \quad (1)$$

[Formula 2]

$$WX_6+cA_aN_b \rightarrow (1/2)W_2N_3+acAX+(bc/2-3/4)N_2\uparrow+(3-ac/2) \quad (2)$$

In formulas (1) and (2), the combination of a, b, and c is defined as follows: $(a, b, c)=(1, 3, 1), (3, 1, 1),$ or $(3, 1, 2)$. Also, "W" represents tungsten, "N" represents nitrogen, and "X" represents a halogen.

The hexagonal tungsten nitride of δ-WN or h-$W_2N_3$ is synthesized as a main product. As the by-products, the salt (AX) is synthesized, and nitrogen ($N_2$) gas and/or halogen ($X_2$) gas are released. It should be noted that the phrase "is synthesized as a (the) main product" used herein means to be synthesized as a (the) compound of which ratio by weight is the largest among the recovered products".

Specifically, when tungsten chloride ($WCl_6$) of the tungsten halide and sodium azide ($NaN_3$) of the alkali metal nitride are used in the reaction at the high temperature and pressure, the metathetical reactions represented by the following reaction formulas (i.e. Formulas (3) and (4)) proceed.

[Formula 3]

$$WCl_6+NaN_3 \rightarrow WN+NaCl+N_2\uparrow+(5/2)Cl_2\uparrow \quad (3)$$

[Formula 4]

$$WCl_6+NaN_3 \rightarrow (1/2)W_2N_3+NaCl+(3/4)N_2\uparrow+(5/2)Cl_2\uparrow \quad (4)$$

The hexagonal tungsten nitride of δ-WN or h-$W_2N_3$ is synthesized as the main product. As the by-products, the salt (NaCl) is synthesized, and nitrogen ($N_2$) gas and chlorine ($Cl_2$) gas are released.

$Li_3N$ may be used as the alkali metal nitride. In this case, in the reaction at the high temperature and pressure, the metathetical reactions represented by the following reaction formulas (i.e. Formulas (5) and (6)) proceed.

[Formula 5]

$$WCl_6+Li_3N \rightarrow WN+3LiCl+(3/2)Cl_2\uparrow \quad (5)$$

[Formula 6]

$$WCl_6+2Li_3N \rightarrow (1/2)W_2N_3+6LiCl+(1/4)N_2\uparrow \quad (6)$$

The hexagonal tungsten nitride of δ-WN or h-$W_2N_3$ is synthesized as the main product. As the by-products, the salt (LiCl) is synthesized, and nitrogen ($N_2$) gas or chlorine ($Cl_2$) gas are released.

In addition, when an alkaline earth metal nitride (which is also represented by "B" herein) is used in the reaction at the high temperature and pressure, the metathetical reactions represented by the following reaction formulas (i.e. Formulas (7) and (8)) proceed.

[Formula 7]

$$WX_6+B_3N_2 \rightarrow WN+3BX_2+1/2 \cdot N_2\uparrow \quad (7)$$

[Formula 8]

$$WX_6+B_3N_2 \rightarrow (1/2)W_2N_3+3BX_2+1/4 \cdot N_2\uparrow \quad (8)$$

In formulas (7) and (8), "W" represents tungsten, "N" represents nitrogen, and "X" represents a halogen.

The hexagonal tungsten nitride of δ-WN or h-$W_2N_3$ is synthesized as the main product. As the by-products, the salt ($BX_2$) is synthesized, and nitrogen ($N_2$) gas is released.

Specifically, the alkaline earth metal nitride such as $Ca_3N_2$ may be used. In this case, in the reaction at the high temperature and pressure, the metathetical reactions represented by the following reaction formulas (i.e. Formulas (9) and (10)) proceed.

[Formula 9]

$$WCl_6+Ca_3N_2 \rightarrow WN+3CaCl_2+(1/2)N_2\uparrow \quad (9)$$

[Formula 10]

$$WCl_6+Ca_3N_2 \rightarrow (1/2)W_2N_3+3CaCl_2+(1/4)N_2\uparrow \quad (10)$$

The hexagonal tungsten nitride of δ-WN or h-$W_2N_3$ is synthesized as the main product. As the by-products, the salt ($CaCl_2$) is synthesized, and nitrogen ($N_2$) gas is released.

In the above reaction at the high temperature and pressure, the mixture of an alkali metal nitride and an alkaline earth metal nitride may be used. For example, the mixture of $Li_3N$ and $Ca_3N_2$ may be used as the nitrogen source.

Preferably, the raw material powders are filled into the capsule. Preferably, the capsule is made of a material which facilitates the reaction with halogen. Specifically, the material may include tungsten or molybdenum. When tungsten or molybdenum is used as the material for the capsule, the whole components of the capsule may be made of tungsten or molybdenum. Or alternatively, the capsule may include another component in addition to tungsten or molybdenum as long as it facilitates the reaction with halogen. Therefore, the phrase "capsule made of tungsten or molybdenum" herein means to include not only the cases where the capsule consists of tungsten or molybdenum but also the cases where the capsule has tungsten or molybdenum and another component, for example, the cases where the main component of the capsule (, which accounts for 50% or more and less than 100% of all the components of the capsule) is tungsten or molybdenum and the remaining component(s) is component(s) except for tungsten or molybdenum.

When the raw material powders are filled into the capsule of which the material is tungsten or molybdenum, even when tungsten chloride is, for example, used as the tungsten halide included in the raw material powders, the hexagonal tungsten nitride can be synthesized. On the other hand, when the raw material powders using tungsten chloride as the tungsten halide included therein are filled into a capsule made of platinum, the synthesis of the hexagonal tungsten nitride is difficult. These are considered as resulting from the following: Although chlorine may be generated when tungsten chloride is used as the tungsten halide included in the raw material powders as described above, tungsten or molybdenum is a material which easily reacts with chlorine, and/or tungsten or molybdenum is a material which easily breaks in the high temperature and pressure state; On the other hand, platinum is a stable material which hardly reacts with chlorine as well as which hardly breaks even in the high temperature and pressure state.

In the reaction at the high temperature and pressure, when tungsten chloride is used as the tungsten halide included in the raw material powders, chlorine gas is generated together with the synthesis of the hexagonal tungsten nitride. When this chlorine gas is accumulated within the capsule, the proceeding of the reaction at the high temperature and pressure is inhibited. When the capsule is made of a material which easily reacts with chlorine, the concentration of the chlorine generated by the reaction at the high temperature and pressure can be reduced, thereby promoting the reaction at the high temperature and pressure. In addition, when the capsule is made of a material which easily breaks in the high temperature and pressure state, the crack or the like is allowed to occur in the capsule in the high temperature and pressure state, and the chlorine gas can be discharged out of the capsule through the crack, thereby promoting the proceeding of the reaction at the high temperature and pressure.

Preferably, the raw material powders are adjusted so that a ratio of the tungsten halide to the alkali metal nitride or alkaline earth metal nitride is within a range from 3:2 (by mole ratio) to 3:1 (by mole ratio). In this case, $\delta$-WN (hexagonal tungsten nitride) is synthesized as the main product. In addition, the raw material powders may be adjusted so that a ratio of the tungsten halide to the mixture of the alkali metal nitride and the alkaline earth metal nitride is within a range from 3:2 (by mole ratio) to 3:1 (by mole ratio).

The raw material powders may be adjusted so that a ratio of the tungsten halide to the alkali metal nitride or alkaline earth metal nitride is 1:6 (by mole ratio), and then may be filled into a capsule made of tungsten. In this case, h-$W_2N_3$ (hexagonal tungsten nitride), (which is also represented by "Phase IV" herein) is synthesized as the main product. In addition, the raw material powders may be also adjusted so that a ratio of the tungsten halide to the mixture of the alkali metal nitride and the alkaline earth metal nitride is 1:6 (by mole ratio).

Then, the high pressure cell is returned to normal pressure and room temperature, and then the reaction products are taken out from the inside of the capsule.

And then, the reaction products are washed with water. In this way, NaCl attached to the reaction products can be dissolved and removed.

After that, the reaction products are dispersed in a solvent (distilled water), followed by precipitation with a centrifugal separator to recover the precipitated products.

Through the processes described above, the hexagonal tungsten nitride of $\delta$-WN or h-$W_2N_3$ can be recovered as the main product of the precipitated products.

Since the method for synthesizing a hexagonal tungsten nitride according to an embodiment of the present invention comprises heating the raw material powders comprising the tungsten halide and the alkali metal nitride and/or the alkaline earth metal nitride to synthesize the hexagonal tungsten nitride, the synthesized hexagonal tungsten nitride can be obtained as the main product. The synthesized hexagonal tungsten nitride can be used as blade materials or hard coating materials for cemented carbide tools used in cutting. This can lead to improve working accuracy of the cemented carbide tools and reduce costs needed to produce parts using the cemented carbide tools.

The method for synthesizing a hexagonal tungsten nitride according to an embodiment of the present invention may comprise heating at 1400° C. or more and 1700° C. or less to synthesize the hexagonal tungsten nitride as the main product.

The method for synthesizing a hexagonal tungsten nitride according to an embodiment of the present invention may comprise applying the pressure at 1 GPa or more upon heating to synthesize the hexagonal tungsten nitride as the main product.

The method for synthesizing a hexagonal tungsten nitride according to an embodiment of the present invention may comprise maintaining, for 1 hour or more, the high temperature and pressure state consisting of the applied pressure of 1 GPa or more and the heating temperature of 1400° C. or more and 1700° C. or less to synthesize the hexagonal tungsten nitride as the main product.

The method for synthesizing a hexagonal tungsten nitride according to an embodiment of the present invention may comprises filling the raw material powders into a capsule made of tungsten or molybdenum, and thus the halogen gas can be discharged out of the capsule. As a result, the reaction at the high temperature and pressure is allowed to be promoted, and thus the hexagonal tungsten nitride can be synthesized as the main product in a high yield.

The method for synthesizing a hexagonal tungsten nitride according to an embodiment of the present invention may comprise adjusting the raw material powders so that a ratio of the tungsten halide to the alkali metal nitride or alkaline earth metal nitride is within a range from 3:2 (by mole ratio) to 3:1 (by mole ratio) to synthesize the hexagonal tungsten nitride as the main product. Also, the raw material powders may be adjusted so that a ratio of the tungsten halide to the mixture of the alkali metal nitride and the alkaline earth metal nitride is within a range from 3:2 (by mole ratio) to 3:1 (by mole ratio).

In the method for synthesizing a hexagonal tungsten nitride according to an embodiment of the present invention, the hexagonal tungsten nitride can have the $\delta$-WN structure, and thus the hexagonal tungsten nitride of $\delta$-WN structure can be synthesized as the main product.

The method for synthesizing a hexagonal tungsten nitride according to an embodiment of the present invention may comprise adjusting the raw material powders so that a ratio of the tungsten halide to the alkali metal nitride or alkaline earth metal nitride is 1:6 (by mole ratio) to synthesize the hexagonal tungsten nitride as the main product. Also, the raw material powders may be adjusted so that a ratio of the tungsten halide to the mixture of the alkali metal nitride and alkaline earth metal nitride is 1:6 (by mole ratio).

In the method for synthesizing a hexagonal tungsten nitride according to an embodiment of the present invention, the hexagonal tungsten nitride can have the h-$W_2N_3$ structure, and thus the hexagonal tungsten nitride of h-$W_2N_3$ structure can be synthesized as the main product.

In the method for synthesizing a hexagonal tungsten nitride according to an embodiment of the present invention, the tungsten halide and the alkali metal nitride may be respectively tungsten chloride ($WCl_6$) and sodium azide ($NaN_3$) to synthesize the hexagonal tungsten nitride as the main product.

The hexagonal tungsten nitride according to an embodiment of the present invention has a particle size of 1 μm or more and 50 μm or less. Thus, the hexagonal tungsten nitride according to an embodiment of the present invention can be used as blade materials or hard coating materials for cemented carbide tools used in cutting, thereby leading to improve working accuracy of the cemented carbide tools and to reduce costs needed to produce parts using the cemented carbide tools.

The method for synthesizing a hexagonal tungsten nitride and the hexagonal tungsten nitride according to an embodiment of the present invention are not limited to the embodiments described above, but may be practiced through various modifications within the scope of the technical ideas of the present invention.

Specific examples of the present embodiments are presented as follows. The present invention, however, is not limited to these Examples.

EXAMPLES (Sample Synthesis)

Example 1-1

FIG. 4 is the drawing showing the configuration of the high pressure cell used in the present Examples.

The high pressure cell has a cylindrical pyrophyllite, two steel rings disposed in the cylinder of the pyrophyllite in contact with the inner wall surface of the cylinder on the upper side and lower side, respectively, a cylindrical carbon heater disposed on the central axis side of the steel rings, a capsule disposed inside the carbon heater, and a raw material powder (described as "Starting material" in FIG. 4) filled into the capsule.

A powder for filling (NaCl+10 wt % $ZrO_2$) is filled in a gap between the pyrophyllite and the carbon heater and a gap between the carbon heater and the capsule.

Hereinafter, sample synthesis will be illustrated using the high pressure cell shown in FIG. 4.

First, tungsten chloride ($WCl_6$) powders and sodium azide ($NaN_3$) powders were mixed so that a ratio of the tungsten chloride to the sodium azide is 3:2 (by mole ratio) to prepare raw material powders.

Then, the raw material powders were filled into a cylindrical capsule made of W of which one end side was closed with a disc-like lid, followed by sealing the other end side with another disc-like lid.

Subsequently, an inner bottom portion in a cylindrical carbon heater of which one end side was closed with a disc-like lid was covered with the powders for filling (NaCl+10 wt % $ZrO_2$), then the sealed capsule made of W was disposed in the cylindrical carbon heater so as to be coaxial therewith, the powders for filling (NaCl+10 wt % $ZrO_2$) were filled in the gap between the capsule and the inner wall surface of the carbon heater, further the upper portion of the capsule was covered with the powders for filling (NaCl+10 wt % $ZrO_2$), and then the other end side was sealed with another disc-like lid.

Subsequently, the sealed cylindrical carbon heater was disposed in the cylindrical pyrophyllite so as to be coaxial therewith, and then the powders for filling (NaCl+10 wt % $ZrO_2$) were filled in the gap between the carbon heater and the inner wall surface of the pyrophyllite.

Subsequently, a steel ring was pressed into the powders for filling on the upper side of the inner wall surface of the pyrophyllite, and another steel ring was pressed into the powder for filling on the lower side of the inner wall surface of the pyrophyllite.

In this manner, the high pressure cell shown FIG. 4 was provided.

Then, the high pressure cell was disposed at a prescribed position in a heating and pressurizing apparatus (i.e. belt-type apparatus).

Then, the high pressure cell was pressurized to 7.7 GPa (77000 atmospheric pressure).

Then, the high pressure cell was heated to 1400° C. in the pressurized state.

Then, in the state where the temperature was 1400° C. and the pressure was 7.7 GPa, the temperature and the pressure were maintained for 1 hour. In this way, the raw material powder was reacted at the high temperature and pressure.

Then, the high pressure cell was returned to normal pressure and room temperature, and the reaction products were taken out from the inside of the capsule.

Then, the reaction products were washed with water. In this way, NaCl attached to the reaction products were dissolved and removed.

Then, the reaction products were dispersed in a solvent (distilled water), followed by precipitating the insoluble material with a centrifugal separator and recovering the precipitated products (the sample of Example 1-1).

Example 1-2

A sample of Example 1-2 was synthesized in the same manner as Example 1-1, except that the heating temperature was 1500° C.

Example 1-3

A sample of Example 1-3 was synthesized in the same manner as Example 1-1, except that the heating temperature was 1600° C.

Example 1-4

A sample of Example 1-4 was synthesized in the same manner as Example 1-1, except that the heating temperature was 1700° C.

Comparative Example 1-1

A sample of Comparative Example 1-1 was synthesized in the same manner as Example 1-1, except that the heating temperature was 1300° C.

Example 1-5

A sample of Example 1-5 was synthesized in the same manner as Example 1-1, except that a cylindrical capsule made of Mo was used and the heating temperature was 1400° C.

Example 1-6

A sample of Example 1-6 was synthesized in the same manner as Example 1-1, except that the cylindrical capsule made of Mo was used and the heating temperature was 1500° C.

Example 1-7

A sample of Example 1-7 was synthesized in the same manner as Example 1-1, except that the cylindrical capsule made of Mo was used and the heating temperature was 1600° C.

Example 1-8

A sample of Example 1-8 was synthesized in the same manner as Example 1-1, except that the cylindrical capsule made of Mo was used and the heating temperature was 1700° C.

Comparative Example 1-2

A sample of Comparative Example 1-2 was synthesized in the same manner as Example 1-1, except that the cylindrical capsule made of Mo was used and the heating temperature was 1100° C.

Comparative Example 1-3

A sample of Comparative Example 1-3 was synthesized in the same manner as Example 1-1, except that the cylindrical capsule made of Mo was used and the heating temperature was 1200° C.

Comparative Example 1-4

A sample of Comparative Example 1-4 was synthesized in the same manner as Example 1-1, except that the cylindrical capsule made of Mo was used and the heating temperature was 1300° C.

Comparative Example 1-5

A sample of Comparative Example 1-5 was synthesized in the same manner as Example 1-1, except that a cylindrical capsule made of Pt was used and the heating temperature was 1100° C.

Comparative Example 1-6

A sample of Comparative Example 1-6 was synthesized in the same manner as Example 1-1, except that the cylindrical capsule made of Pt was used and the heating temperature was 1400° C.

Comparative Example 1-7

A sample of Comparative Example 1-7 was synthesized in the same manner as Example 1-1, except that the cylindrical capsule made of Pt was used and the heating temperature was 1700° C.

Example 1-9

A sample of Example 1-9 was synthesized in the same manner as Example 1-1, except that the ratio of the tungsten chloride ($WCl_6$) powders to the sodium azide ($NaN_3$) powders was 3:1 (by mole ratio).

Example 1-10

A sample of Example 1-10 was synthesized in the same manner as Example 1-1, except that the ratio of the tungsten chloride ($WCl_6$) powders to the sodium azide ($NaN_3$) powders was 1:6 (mol).

(Sample Analysis)

First, the XRD measurements were performed for the samples of Examples 1-1 to 1-10 and Comparative Examples 1-1 to 1-7.

FIGS. 5-8 are the XRD profiles showing the results. The apparatus used for the measurements is RIGAKU RINT2200V.

Figure 5:
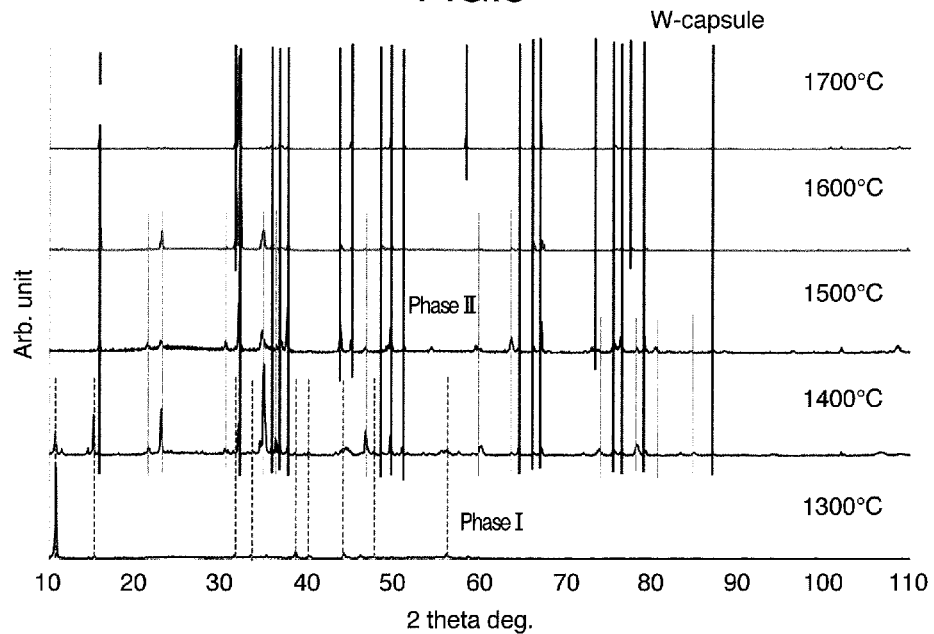
FIG. 5 is the XRD profiles of the samples of Example 1-1 to Example 1-4 and Comparative Example 1-1.

FIG. 5 is the XRD profiles for the samples of Example 1-1 to 1-4 and Comparative Example 1-1. FIG. 5 shows the heating temperature-dependence of the samples synthesized using the capsule made of W.

The thick solid lines indicate the peak positions of the hexagonal WN, the thin solid lines indicate the peak positions of Phase II, and the dotted lines indicate the peak positions of Phase I.

As shown in FIG. 5, the synthesis of the hexagonal tungsten nitride was confirmed in the cases of the heating temperature of 1400° C. or more.

As the heating temperature rose, the hexagonal tungsten nitride yield increased.

At the heating temperature of 1700° C., the hexagonal tungsten nitride having an almost single phase was synthesized.

FIG. 6 is the XRD profiles for the samples of Example 1-5 to 1-8 and Comparative Example 1-2 to 1-4. FIG. 6 shows the heating temperature-dependence of the samples synthesized using the capsule made of Mo.

The thick solid lines indicate the peak positions of the hexagonal WN, the thin solid lines indicate the peak positions of Phase II, and the dotted lines indicate the peak positions of Phase I.

As shown in FIG. 6, the synthesis of the hexagonal tungsten nitride was confirmed in the cases of the heating temperature of 1400° C. or more.

As the heating temperature rose, the hexagonal tungsten nitride yield increased.

At the heating temperature of 1700° C., the hexagonal tungsten nitride having an almost single phase was synthesized.

On the other hand, at the heating temperature of 1300° C., only the hexagonal tungsten nitride of Phase I was synthesized. In addition, at the heating temperature of 1200° or less, the products were amorphous.

FIG. 7 is the XRD profiles for the samples of Comparative Example 1-5 to 1-7. FIG. 7 shows the heating temperature-dependence of the samples synthesized using the capsule made of Pt.

As shown in FIG. 7, the hexagonal tungsten nitride was not synthesized, and another phase (Phase V) was synthesized in the whole heating temperature ranges.

This is thought to be because the Pt capsule has high sealability and low reactivity with chlorine, thereby allowing the chlorine gas ($Cl_2$) released as a by-product in the reaction at the high temperature and pressure to remain within the capsule, and thus the chlorine gas ($Cl_2$) inhibited the synthesis.

From the results described above, in the case where the tungsten chloride ($WCl_6$) powders and the sodium azide ($NaN_3$) powders are prepared as the raw material powders, the hexagonal tungsten nitride is considered as being synthesized by the following: using the capsule made of the material quality capable of reducing the chlorine concentration by reacting with chlorine gas; or providing the capsule with a function which breaks at a high temperature and rapidly discharges the chlorine gas.

Figure 8:
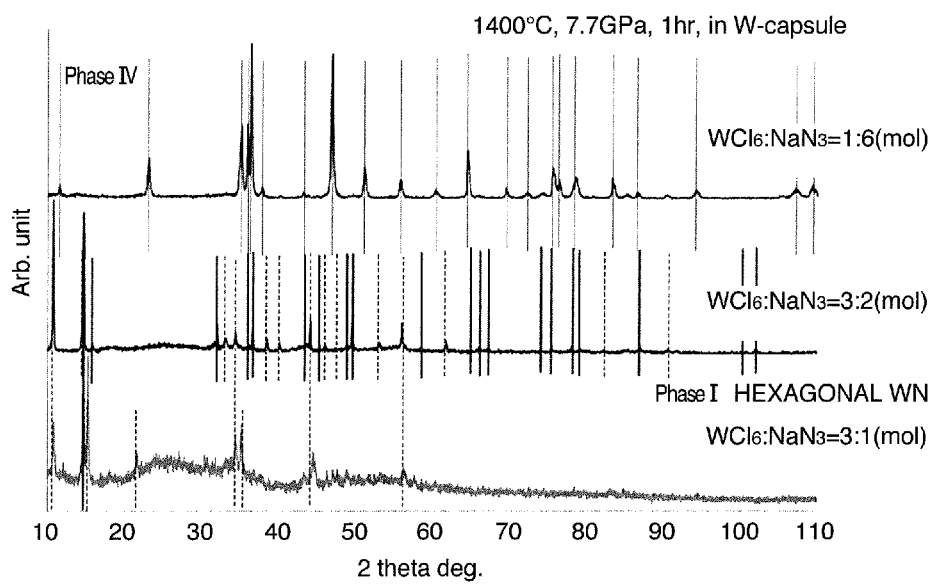
FIG. 8 is the XRD profiles of the samples of Example 1-1, Example 1-9, and Example 1-10.

FIG. 8 is the XRD profiles for the samples of Example 1-1, Example 1-9, and Example 1-10. FIG. 8 shows the dependence on the compositions of the raw material powders.

The thick solid lines indicate the peak positions of the hexagonal WN, the thin solid lines indicate the peak positions of Phase IV, and the dotted lines indicate the peak positions of Phase I.

As shown in FIG. 8, the synthesis of the hexagonal tungsten nitride was confirmed when the compositions of $WCl_6:NaN_3$ used as the raw material powders were 3:2 (by mole ratio) or 3:1 (by mole ratio). In the case of the ratio of $WCl_6:NaN_3=3:2$ (by mole ratio), the hexagonal tungsten nitride was the major synthetic phase. In addition, in the case of the ratio of 3:1 (by mole ratio), Phase I was clearly observed, and small peaks of hexagonal WN were also observed.

On the other hand, when the compositions of $WCl_6:NaN_3$ used as the raw material powders were 1:6 (by mole ratio), i.e., when $NaN_3$ in the compositions used as the raw material powders is excessive, the hexagonal tungsten nitride of h-$W_2N_3$ was obtained but the hexagonal tungsten nitride of δ-WN was not obtained.

Then, electron microscope observation was performed for the sample of Example 1-4. The apparatus used for the measurement was JEOL JSM-5410.

Figure 9:
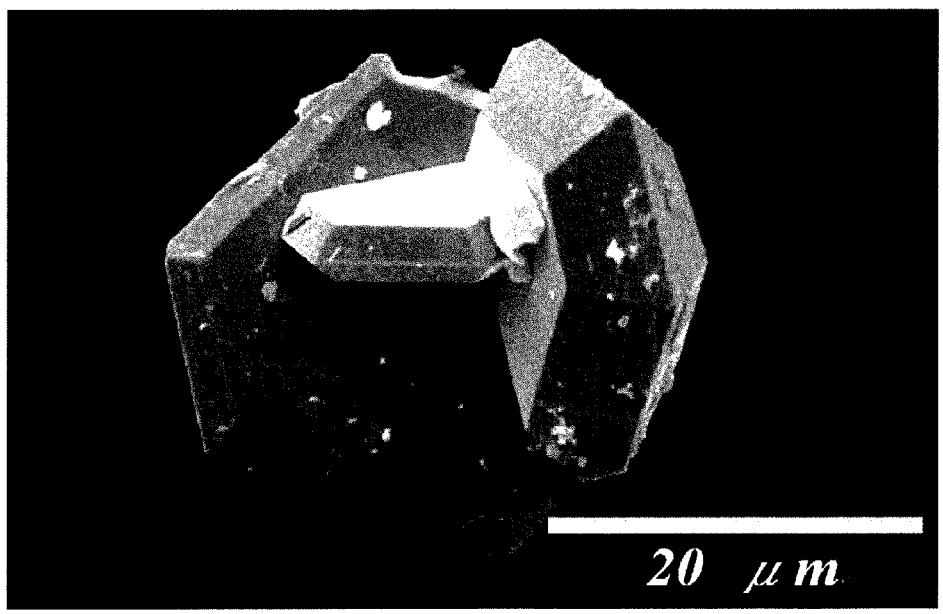
FIG. 9 is the photograph showing an example of the results of the electron microscope observation for the sample of Example 1-4.

FIG. 9 is the photograph showing an example of the results of the electron microscope observation for the sample of Example 1-4.

As shown in FIG. 9, the hexagonal crystals of which a particle size is 1 μm or more and 50 μm or less were confirmed to be synthesized.

Then, the micro area X-ray diffraction measurement was performed for the sample of Example 1-4.

Figure 10:
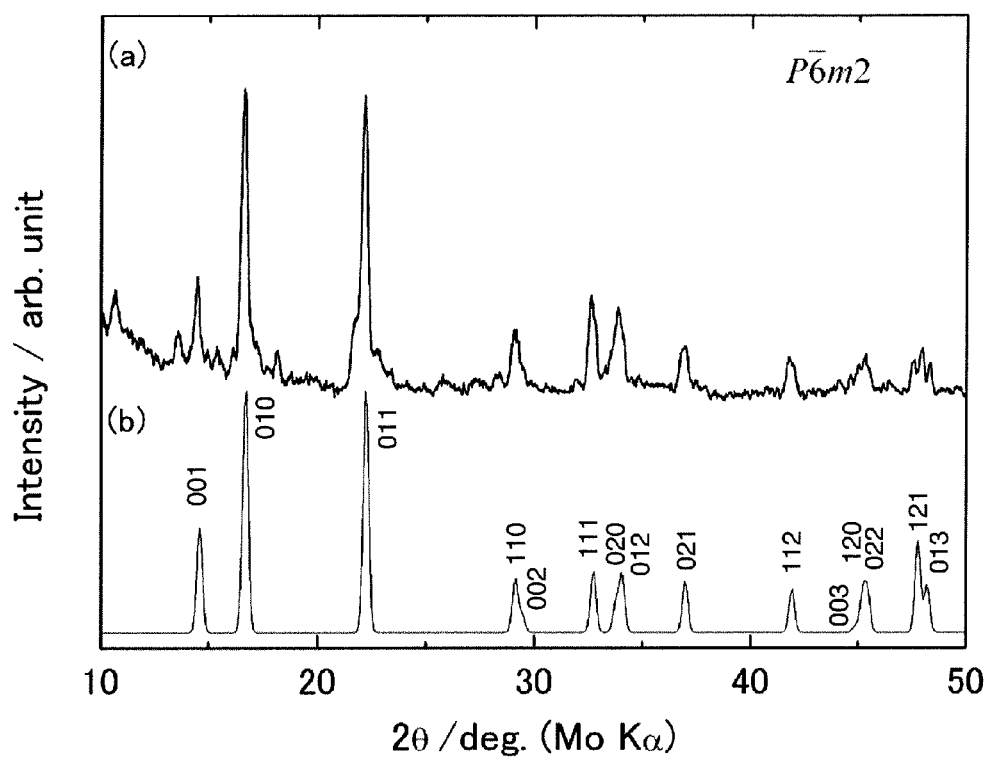

FIG. 10 is the profiles showing the results of the micro area X-ray diffraction measurement for the sample of Example 1-4 in which FIG. 10(*a*) indicates the observed data and FIG. 10(*b*) indicates the theoretical data for hexagonal WN.

As shown in FIG. 10, the peak positions of the observed data and those of the theoretical date completely coincided with each other. Thereby, it was confirmed that the crystal of the samples of Example 1-4 was hexagonal WN.

Then, composition analysis by the combustion method was performed for the sample of Example 1-4.

As the result that the composition analysis by the combustion method was performed using the crystal of the sample of Example 1-4, which is a sample weight of 1.584 mg, the nitrogen content was 0.1051 mg and W/N=0.93 (at. ratio), and thus the crystal composition of the sample of Example 1-4 was confirmed to be WN.

The conditions and the results described above were summarized in Table 1.

TABLE 1

| | Applied pressure (GPa) | Heating temperature (° C.) | Capsule material | $WCl_6$: $NaN_3$ (mol) | Main product | Remarks |
|---|---|---|---|---|---|---|
| Example 1-1 | 7.7 | 1400 | W | 3:2 | δ-WN | Phase II present |
| Example 1-2 | 7.7 | 1500 | W | 3:2 | δ-WN | Phase II present |
| Example 1-3 | 7.7 | 1600 | W | 3:2 | δ-WN | |
| Example 1-4 | 7.7 | 1700 | W | 3:2 | δ-WN | |
| Example 1-5 | 7.7 | 1400 | Mo | 3:2 | δ-WN | |
| Example 1-6 | 7.7 | 1500 | Mo | 3:2 | δ-WN | |
| Example 1-7 | 7.7 | 1600 | Mo | 3:2 | δ-WN | |
| Example 1-8 | 7.7 | 1700 | Mo | 3:2 | δ-WN | |
| Example 1-9 | 7.7 | 1400 | W | 3:1 | δ-WN | Low yield of main product (=PhaseIV) |
| Example 1-10 | 77 | 1400 | W | 1:6 | h-$W_2N_3$ | |
| Comparative Example 1-1 | 7.7 | 1300 | W | 3:2 | Phase I only | |
| Comparative Example 1-2 | 7.7 | 1100 | Mo | 3:2 | Amorphous | |
| Comparative Example 1-3 | 7.7 | 1200 | Mo | 3:2 | Amorphous | |
| Comparative Example 1-4 | 7.7 | 1300 | Mo | 3:2 | Phase I only | |
| Comparative Example 1-5 | 7.7 | 1100 | Pt | 3:2 | Phase V only | |
| Comparative Example 1-6 | 7.7 | 1400 | Pt | 3:2 | Phase V only | |
| Comparative Example 1-7 | 7.7 | 1700 | Pt | 3:2 | Phase V only | |

INDUSTRIAL APPLICABILITY

Since the method for synthesizing a hexagonal tungsten nitride according to the present invention is a method capable of synthesizing the hexagonal tungsten nitride as the main product, and the hexagonal tungsten nitride according to the present invention has a large diameter, the hexagonal tungsten nitride can be utilized as cemented carbide materials for use in grinding and cutting tools (e.g., drills, end mills, hobs, milling cutters, lathes, and pinion type cutters) and the like, can be used for blade materials or hard coating materials for cemented carbide tools used in cutting, and thus has availability in the machining tool industry, the processing industry, processing machine industry and the like.

REFERENCE SIGNS LIST

1: high pressure cell, 11: pyrophyllite container (cylinder), 12A, 12B: steel ring, 13, 14: powder for filling (NaCl+10 wt % $ZrO_2$), 15: carbon heater, 16: capsule, 17: raw material powder, 21: heating and pressurizing apparatus, 25A, B: anvil, 26A, B: electric conductor, 27A, B: cylinder, 28: pyrophyllite (for filling)

The invention claimed is:

1. A method of synthesizing a hexagonal tungsten nitride, wherein the hexagonal tungsten nitride is synthesized by heating raw material powders comprising a tungsten halide and an alkali metal nitride or alkaline earth metal nitride or raw material powders comprising a tungsten halide and a mixture of an alkali metal nitride and an alkaline earth metal nitride.

2. The method according to claim 1, wherein the heating is conducted at a temperature in a range of 1400° C. or more and 1700° C. or less.

3. The method according to claim 2, wherein the heating is conducted under an applied pressure of 1 GPa or more.

4. The method according to claim 3, wherein the heating is conducted for one hour or more in a high temperature and pressure state of a temperature in a range of 1400° C. or more and 1700° C. or less and an applied pressure of 1 GPa or more.

5. The method according to claim 4, wherein the raw material powders to be heated are filled into a capsule made of tungsten or molybdenum.

6. The method according to claim 5, wherein the raw material powders comprising the tungsten halide and the alkali metal nitride or alkaline earth metal nitride are adjusted so that a mole ratio of the tungsten halide to the alkali metal nitride or alkaline earth metal nitride is within a range from 3:2 to 3:1.

7. The method according to claim 6, wherein the hexagonal tungsten nitride has a structure of δ-WN.

8. The method according to claim 5, wherein the raw material powders are adjusted so that a mole ratio of the tungsten halide to the alkali metal nitride or alkaline earth metal nitride is 1:6.

9. The method according to claim 8, wherein the hexagonal tungsten nitride has a structure of h-$W_2N_3$.

10. The method according to claim 1, wherein the tungsten halide is tungsten chloride and the alkali metal nitride is sodium azide.

11. A hexagonal tungsten nitride with a particle size in a range of 1 μm or more and 50 μm or less.

12. The method according to claim 1, wherein the tungsten halide is selected from the group consisting of tungsten fluoride, tungsten bromide, tungsten iodide and tungsten chloride.

13. The method according to claim 1, wherein the alkali metal nitride is sodium azide or lithium nitride.

14. The method according to claim 1, wherein the alkaline earth metal nitride is selected from the group consisting of calcium nitride, magnesium nitride, strontium nitride and barium nitride.

15. The method according to claim 1, wherein the raw material powders further comprises at least one material selected from the group consisting of metallic tungsten, alkali metal, alkaline earth metal, tungsten oxide, and NaCl.

16. The method according to claim 1, wherein reaction products obtained by the heating are washed with water.

17. The hexagonal tungsten nitride according to claim 11 comprising a plate-like hexagonal shape, the plate-like hexagonal shape having two hexagonal faces parallel to each other and twelve trapezoid-shaped faces formed between the two faces.

18. The hexagonal tungsten nitride according to claim 11, wherein the particle size is in a range of 10 μm or more and 30 μm or less.

19. The hexagonal tungsten nitride according to claim 11 comprising a structure of δ-WN or h-$W_2N_3$.

20. A cemented carbide material comprising the hexagonal tungsten nitride according to claim 11.

\* \* \* \* \*